United States Patent
Pritchard et al.

(10) Patent No.: US 7,353,484 B1
(45) Date of Patent: Apr. 1, 2008

(54) METHODS AND APPARATUS FOR VARIABLE LATENCY SUPPORT

(75) Inventors: J. Orion Pritchard, Santa Cruz, CA (US); Todd Wayne, Soquel, CA (US)

(73) Assignee: Altera Corporation, San Jose, CA (US)

(*) Notice: Subject to any disclaimer, the term of this patent is extended or adjusted under 35 U.S.C. 154(b) by 421 days.

(21) Appl. No.: 10/775,966

(22) Filed: Feb. 9, 2004

(51) Int. Cl.
*G06F 17/50* (2006.01)
(52) U.S. Cl. .................................. 716/16; 716/17
(58) Field of Classification Search ........... 716/1, 716/16–17; 710/1, 9, 100, 106, 110, 300, 710/305, 306
See application file for complete search history.

(56) References Cited

U.S. PATENT DOCUMENTS 6,061,737 A * 5/2000 Fite et al. ................... 709/243
6,725,313 B1 * 4/2004 Wingard et al. ............ 710/305
6,996,016 B2 * 2/2006 Oh ............................. 365/193

OTHER PUBLICATIONS

Andrew DeHon, "Notes on Coupling Processors with Reconfigurable Logic", MIT Transit Project, Transit Note #118, downloaded from www.cs.caltech.eduresearch/ic/transit/tn118/tn118.html Mar. 1995, 29 pages.

* cited by examiner

*Primary Examiner*—Vuthe Siek
(74) *Attorney, Agent, or Firm*—Beyer Weaver LLP

(57) ABSTRACT

Methods and apparatus are provided for interconnecting primary components with secondary components on a programmable chip. Control, data, and address lines are automatically generated to connect primary components and secondary components with an interconnection module. The interconnection connection module manages interaction between primary components and secondary components and provides support for fixed latency and variable latency secondary components.

27 Claims, 8 Drawing Sheets

METHODS AND APPARATUS FOR VARIABLE LATENCY SUPPORT

BACKGROUND OF THE INVENTION

1. Field of the Invention

The present invention relates to fixed and variable latency peripherals. More specifically, the present invention relates to methods and apparatus for generating control and routing lines to allow primary and secondary components to interact using fixed or variable latency.

2. Description of Related Art

Conventional programmable chip systems often include a variety of primary components and secondary components, such as processors, memory, parallel input/output interfaces, timers, etc. The primary and secondary components can interact using a variety of mechanisms. In one example, secondary components are fixed latency peripherals. The secondary components are configured to return data requested by a primary component within a fixed number of clock cycles.

Some secondary components, such as memory, can return data at different rates. Without variable latency support, efficiency is decreased as only a single read access can be pending at any given time. However, with variable latency, the throughput can increase to one access per clock cycle.

However, techniques and mechanisms for providing fixed and variable latency support for programmable chips are limited. Consequently, it is therefore desirable to provide improved methods and apparatus for supporting fixed and variable latency components. In one example, it is desirable to provide logic and circuitry to interconnect primary and secondary component using robust and flexible mechanisms.

SUMMARY OF THE INVENTION

Methods and apparatus are provided for interconnecting primary components with secondary components on a programmable chip. Control, data, and address lines are automatically generated to connect primary components and secondary components with an interconnection module. The interconnection connection module manages interaction between primary components and secondary components and provides support for fixed latency and variable latency secondary components.

In one embodiment, a method for configuring a programmable chip is provided. Information associated with a primary component is received. The primary component has either fixed latency or variable latency characteristics. Information associated with a secondary component is received. The secondary component has either fixed latency or variable latency characteristics. The secondary component is operable to respond to requests from the primary component generating an interconnection module coupling the primary component to the secondary component, the interconnection module including data, address, and control lines. The interconnection module supports a system having both fixed and variable latency components In another embodiment, a system for configuring a programmable chip is provided. The system includes an input interface and a processor. The input interface is configured to receive information associated with a primary component and information associated with a secondary component. The secondary component has fixed latency or variable latency characteristics and is operable to respond to requests from the primary component. A processor is configured to generate an interconnection module coupling the primary component to the secondary component. The interconnection module includes data, address, and control lines for the programmable chip. The interconnection module supports a system having both fixed and variable latency components These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
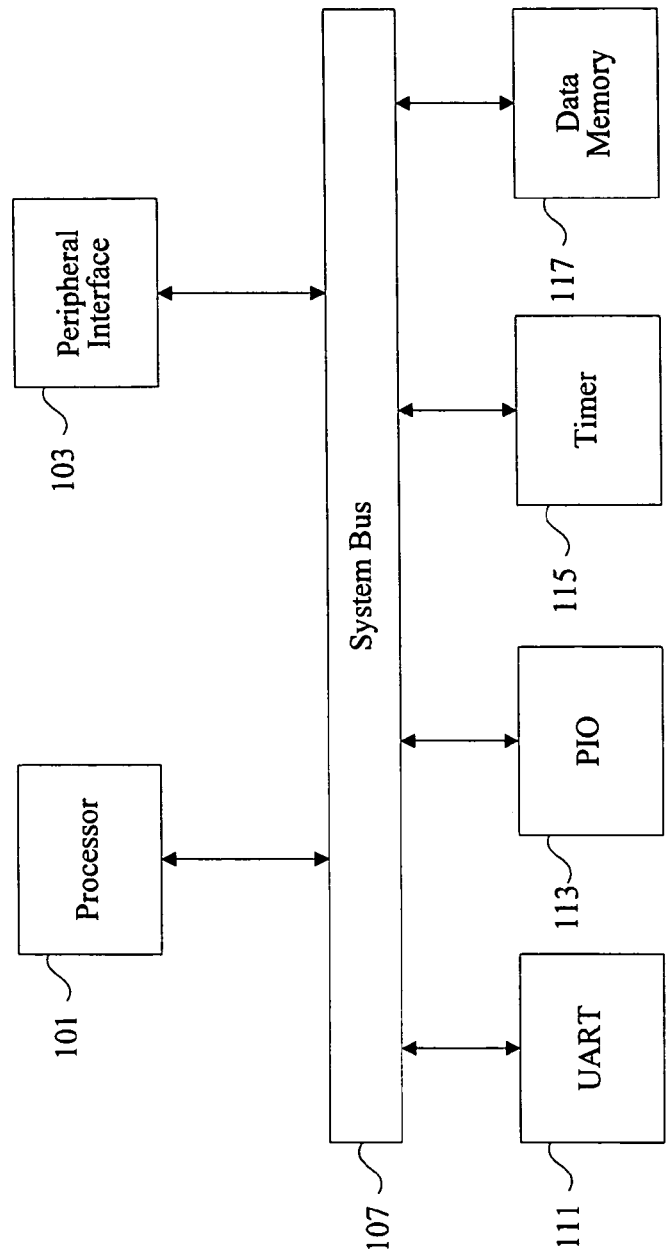
FIG. 1 is a diagrammatic representation showing a programmable chip.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scop he he e of the invention as defined by the appended claims. For example, the techniques of the present invention will be described in the context of particular processors and memory.

However, it should be noted that the techniques of the present invention can be applied to a variety of types of devices. In the following description, numerous specific details are set forth in order to provide a thorough understanding of the present invention. The present invention may be practiced without some or all of these specific details. In other instances, well known process operations have not been described in detail in order not to unnecessarily obscure the present invention.

A primary component such as a processor on a programmable chip can access a secondary component such as a memory in a variety of different manners. In one example, a primary component issues a read request for a particular memory line. The read request may be handled by a memory controller associated with the processor. The processor may then wait for a response from the secondary memory component. However, secondary components such as a memory component can return data at different rates based upon a variety of factors. Using fixed latency, a processor issues a request and waits until a response is provided. No pipelining can occur and only one read access can be pending at any given time.

Variable latency is sometimes used to increase throughput for various secondary components. Using variable latency, the throughput can increase to one data access per clock cycle. Consequently, the techniques of the present invention provide mechanisms for automatically supporting variable latency and fixed latency secondary components. In one example, a programmable chip configuration tool allows a user to configure a primary component to issue multiple reads to a secondary component using variable latency. The secondary component is operable to specify when its read data is valid. In one example, the secondary component is a Synchronous Dynamic Random Access Memory (SDRAM). Read requests are queued in a First In First Out (FIFO) buffer. When valid data is available, the data is presented along with a data valid bit to a primary component through automatically generated routes. According to various embodiments, control lines and data routing logic are automatically generated to support a system with both fixed latency and variable latency secondary components. Customized peripherals can be easily supported without concern for how the components will interact, since a generated interconnection architecture will manage fixed and variable latency interactions.

FIG. 1 is a diagrammatic representation showing a system on a programmable chip having a processor core, peripheral devices, and peripheral interfaces. Peripheral devices and peripheral interfaces are herein referred to as components. The system on a programmable chip includes processor core 101 and a peripheral interface 103 as well as peripheral components UART 111, PIO 113, timer 115, and data memory 117. In some examples, the peripheral interface 103 is a memory controller with an associated bus bridge. It should be noted that the system can include both on-chip and off-chip memory. In one example, the data memory 17 can support variable latency or fixed latency.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

The techniques of the present invention for supporting fixed or variable latency can be applied to a variety of system architectures. In one example, variable latency and fixed latency can be supported on a system using a conventional bus architecture.

Figure 2:
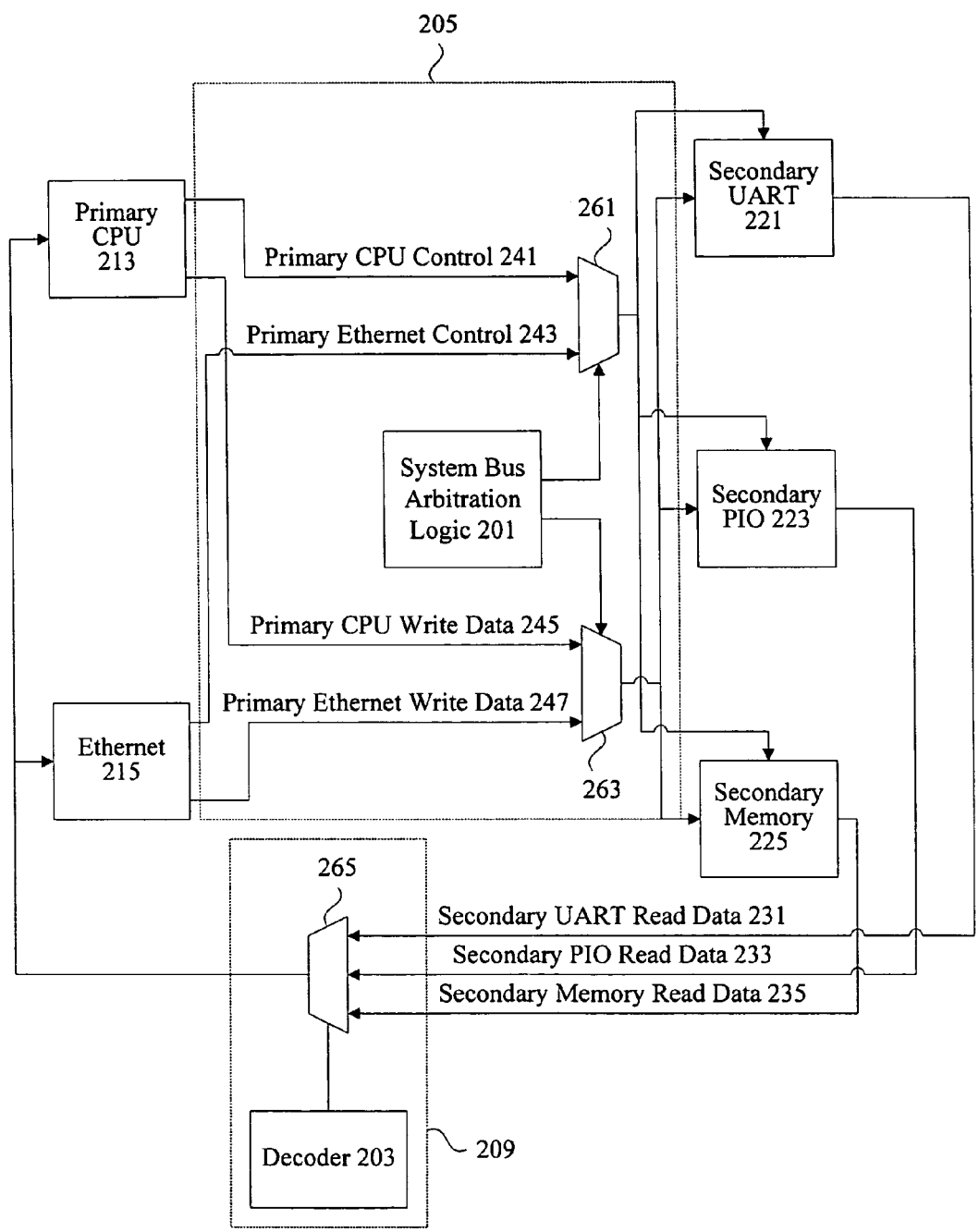
FIG. 2 is a diagrammatic representation showing a system using a conventional bus.

FIG. 2 is a diagrammatic representation depicting a memory component such as an SDRAM coupled to a microprocessor in a system using a conventional bus architecture. The techniques and mechanisms of the present invention recognize that an efficient peripheral interface can be implemented in a system using a conventional bus architecture, even though such an architecture is not ideal.

A conventional bus architecture includes a system bus arbitrator 205. A system bus arbitrator 205 includes arbitrator switching circuitry 261 and 263 as well as system bus arbitration logic 201. Logic and mechanisms for selecting an input based on a control signal are referred to herein as arbitrator switching circuitry. It should be noted that although switching circuitry generally can be implemented using multiplexers, a variety of mechanisms including switches and transistors can be used.

Any component or device that is operable to initiate read and write operations by providing control information is referred to herein as a primary component. Primary components are sometimes referred to as master components. Control information can include a particular address associated with a secondary component. Any component or device that responds to read or write operations with information sent back to the primary component regarding the read or write operation is referred to herein as a secondary component. Secondary components are sometimes referred to as slave components. Some examples of primary components are processors, microcontrollers, and Ethernet devices. Some examples of secondary components are Universal Asynchronous Receiver Transmitters (UARTs), Parallel Input Output (PIO), program memory, and data memory. It should be noted that some components such as an Ethernet component can be both a primary component and a secondary component, as an Ethernet component has the capability of reading and writing to the secondary program memory while also responding to instructions from a primary system CPU.

Logic and mechanisms for providing the control signal based on criteria such as fairness or priority are referred to herein as arbitration logic. The inputs of the arbitrator switching circuitry 261 and 263 are connected to primary CPU 213 and primary Ethernet 215. The outputs of the arbitrator switching circuitry 261 and 263 are connected to secondary UART 221, secondary PIO 223, and secondary peripheral interface 225. The outputs of the secondary components transmit information such as read data back to the primary components through a decoder 209. Mechanisms for selecting secondary components and translating control information such as addresses is referred to herein as a decoder. In conventional computer systems, there is a single decoder for each bus. A decoder 209 includes decoder logic 203 and decoder switching circuitry 265 for selecting the particular secondary component data transfer. A decoder can also be referred to as a primary side arbitrator including primary side arbitration logic and primary side switching circuitry.

A system bus typically has a set width (e.g. 64 bits, 128 bits) and allows only one primary component to actively use the bus at any one time. In conventional systems, only one primary component can access any one of the given secondary components and any given time. Multiple primary components accessing secondary components in a manner that would cause data bit collisions if performed on the same data lines is referred to herein as accessing secondary components at the same time.

In one example, an Ethernet device is accessing a secondary PIO. While the Ethernet device is accessing the secondary PIO, a processor can not access an SDRAM through a peripheral interface even if both the primary streaming output device and the peripheral interface are available.

The system bus arbitration logic 201 determines which primary component has access to the system bus at any time. The system bus arbitrator 201 can determine which primary component can access a secondary component based on criteria such as fairness or priority. Any component or device that is configured to ensure that only one primary component can access any one of the secondary components at any given time is referred to herein as a system bus arbitrator. Various schemes such as weighted fairness can be implemented to improve the efficiency of secondary component access, but such schemes can increase system complexity and latency. In conventional implementations, a computer system includes a single system bus arbitrator for each bus in the computer system.

According to various embodiments of the present invention, it is recognized that a bus is no longer required in certain applications such as system on a chip, system on a programmable chip, and other computer system implementations. A device such as a programmable logic device (PLD) or a field programmable gate array (FPGA) using a hardware descriptor language (HDL) is herein referred to as a programmable chip. Instead of implementing complicated bus sharing schemes using mechanisms such as splitting, the bus itself can be eliminated to improve system performance. According to specific embodiments, it is recognized that primary components and secondary components need not be routed through a construct such as a bus. By not routing signals through a bus, a streaming output device can be implemented in a much more efficient manner. The conventional data and address lines that make up the bus are no longer the resource in contention. Instead, secondary components are resources in contention, as the number of physical lines connected to each secondary component in a system can be fixed.

Consequently, a system bus arbitrator associated with all the secondary components in a computer system is no longer needed. Instead, secondary components themselves that may be accessed by more than one primary component are assigned individual secondary side arbitrators. An arbitrator that corresponds to a specific secondary component accessible by more than one primary component is referred to herein as a secondary side arbitrator. In one embodiment, there is a secondary side arbitrator for each secondary component in a computer system. In other embodiments, there is a secondary side arbitrator for selected secondary components in a system. The techniques of the present invention recognize that fixed and variable latency support can be generated in a system using secondary side arbitration.

Figure 3:
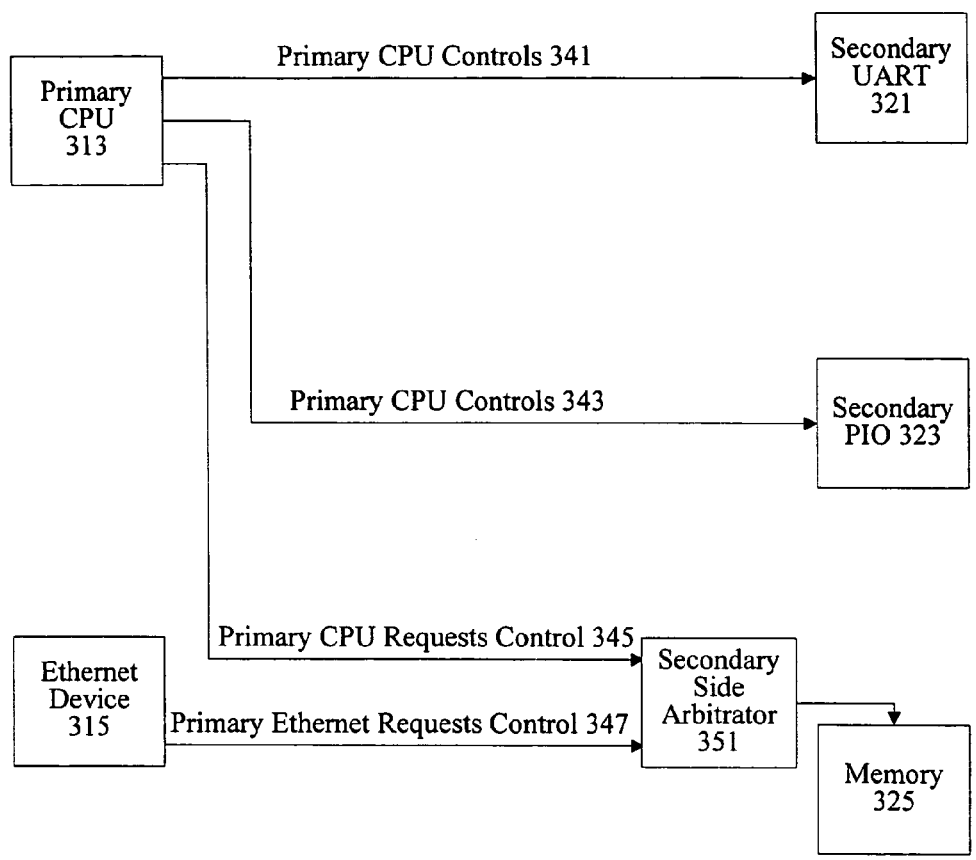
FIG. 3 is a diagrammatic representation showing a system having simultaneous multiple primary components.

FIG. 3 is a diagrammatic representation showing one example of a system using secondary side arbitration, sometimes referred to as slave side arbitration, simultaneous multiple primary components, or simultaneous multiple masters. A system using individual arbitrators that correspond to individual secondary components accessible by more than one primary component is referred to herein as a secondary side arbitration system. The secondary side arbitration system no longer requires a bus or a system bus arbitrator that prevents a second primary component from accessing a second secondary component when a first primary component is accessing a first secondary component. According to various embodiments a secondary component such as peripheral interface 325 is associated with a secondary side arbitrator 351. However, secondary components UART 321 and PIO 323 are not associated with any arbitrator. In one example, secondary component UART 321 and secondary PIO 323 can only be accessed by primary CPU 313 and not by primary Ethernet device 315. A secondary memory component 325, however, can be accessed by both primary CPU 313 and primary Ethernet device 315.

According to various embodiments, a secondary side arbitrator 351 allows a first secondary component in a system to be accessed by a first primary component at the same time a second secondary component in the system is accessed by a second primary component. For example, peripheral interface 325 can be accessed by primary Ethernet 315 through secondary side arbitrator 351 at the same time, secondary UART 321 is accessed by primary CPU 313.

By allowing a CPU to access a secondary component at the same time another primary component such as a streaming output device or an Ethernet component is accessing memory, bus bottlenecks can be reduced.

Figure 4:
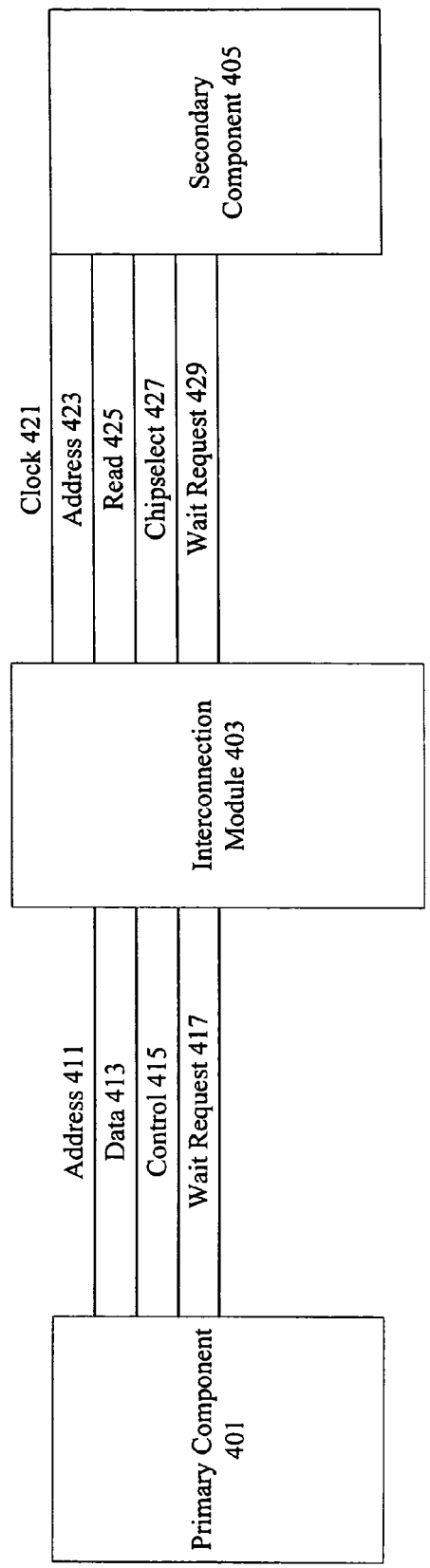
FIG. 4 is a diagrammatic representation showing a system with a primary component and a secondary component.

FIG. 4 is a diagrammatic representation of one example of a system on a programmable chip 400 having a primary component, an interconnection module, and a secondary component. According to various embodiments, the techniques of the present invention allow multiple primary components including primary component 401 to interact with multiple secondary components 405. The individual components, such as peripheral interfaces and peripheral components, may be obtained from a library of components or may be customized by particular users. In some examples, a secondary component 405 may be configured to support fixed latency data access. A primary component 401 in typical instances is configured to operate specifically with the fixed latency component. However, the techniques of the present invention allow the primary component 401 to operate with a secondary component 405 without having any knowledge of fixed or variable latency support.

The techniques of present invention provide an interconnection module 403. The interconnection module 403 may be based on a conventional bus architecture or may use a simultaneous multiple primary component fabric as described in FIG. 3. The interconnection module 403 manages interactions between primary component 401 and secondary component 405. According to various embodiments, the interconnection module 403 provides support for fixed or variable latency requests. In some examples, fixed latency is supported. To provide fixed latency, address 411, data 413, and control lines 415 are provided between a primary component 401 and an interconnection module 403. The wait requests line 417 is also provided. The wait request line 417 is used indicate when a primary component should wait. An interconnection module 403 also routes clock lines 421, address lines 423, read lines 425, chip select lines 427, and wait request lines 429 to a secondary component 405. A read data line 431 is routed from the secondary component 405 to the interconnection module 403.

In one example, a secondary component 405 is accessed without using a wait request line by using fixed wait states. Secondary component read transfers with wait states are useful for peripherals that cannot present data within a single clock cycle but provide data with a given number of cycles. For example, with one fixed wait state specified, the interconnection module 403 presents a valid address and control, but waits for two clock cycles before capturing data from the secondary component 405. According to various embodiments, fixed wait states for a peripheral are declared in the PTF file. The interconnection module waits a fixed number of bus cycles every read transfer.

Using the wait request line, secondary component or peripheral controlled wait states allow a secondary component to stall the interconnection module 403 for as many bus cycles as required to present data. Using the secondary component controlled wait state, a peripheral can take a variable amount of time to present data to the interconnection module 403.

In one example, a first bus cycle starts on the rising edge of clock line 421. A primary component 401 provides an address over address line 411. Address 423 and read 425 from the interconnection module 403 to the secondary component 405 are valid. The interconnection module 403 decodes the address and asserts chipselect 427. In some examples, the secondary component 405 asserts waitrequest 429 before the next rising edge of clk 421. The interconnection module 403 samples waitrequest 429 at the rising edge of clk 421. The waitrequest is forwarded to primary component 401 along waitrequest line 417. With waitrequest asserted throughout, a potentially infinite number of bus cycles can elapse. When a secondary component provides valid read data 431, the secondary component deasserts waitrequest 429. The interconnection module 403 then captures the read data 431 and forwards the data on data line 413.

Figure 5:
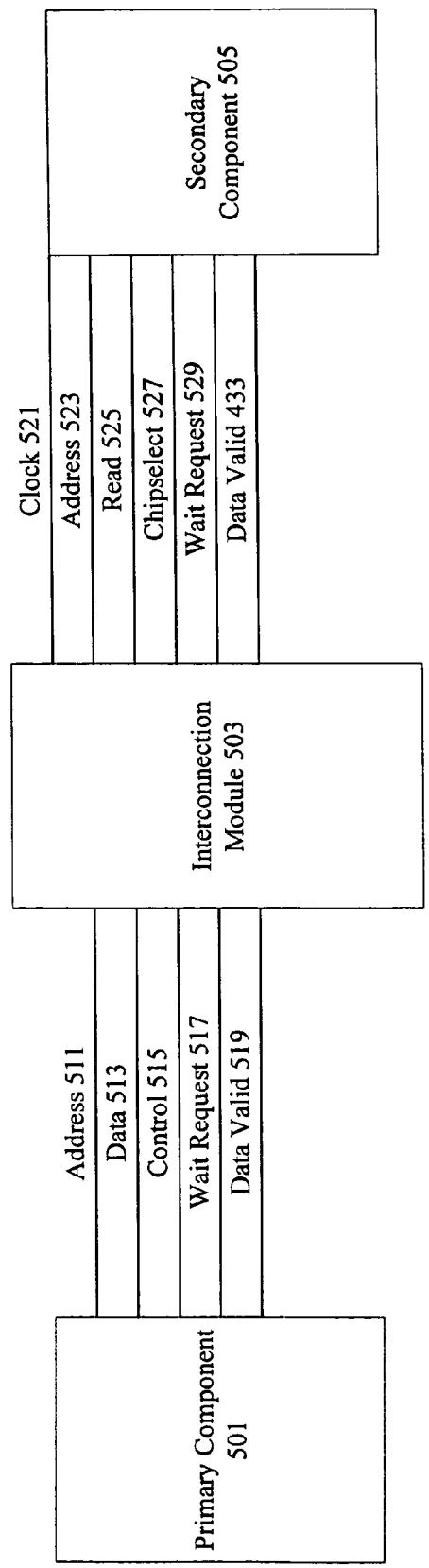
FIG. 5 is a diagrammatic representation showing a primary component and a secondary component.

FIG. 4 shows an architecture that supports fixed latency. FIG. 5 shows an architecture that supports variable latency with the addition of a data valid line. Any mechanism used to indicate to a primary component that data is available from a secondary component is referred to herein as a data valid line. In some examples, a data valid line is used indicate when data is available for reading from a memory buffer. According to various embodiments, the techniques of present invention provide an interconnection module 503. The interconnection module 503 may be based on a conventional bus architecture or may use a simultaneous multiple primary component fabric as described in FIG. 3. The interconnection module 503 manages interactions between primary component 501 and secondary component 505. According to various embodiments, the interconnection module 503 provides support for variable latency requests. To provide variable latency support, address line 511, data line 513, a control lines 515 are provided between a primary component 501 and an interconnection module 503. The wait requests line 517 is also provided. The wait request line 517 is used indicate that a primary component 501 should wait. An interconnection module 503 also routes clock lines 521, address lines 523, read lines 525, chip select lines 527, and wait request lines 529 to a secondary component 505. A read data line 531 is routed from the secondary component 505 to the interconnection module 503.

In one example, a secondary component 505 can receive multiple read request addresses before any data is returned using variable latency. According to various embodiments, the interconnection module 503 receives a read request from a primary component 501 and asserts address 523, read 525, and chipselect 527 to initiate a read transfer. If a secondary component 505 has reached its maximum number of allowed pending transfers, and does not have valid data to return, the peripheral 505 asserts waitrequest 529 until it can return data for the first pending transfer.

When data is available, the secondary component drives a valid read data 531, asserts readdatavalid 533, and deasserts wait request 529 because it can accept another pending read transfer. However, the secondary component does not have to deassert wait request 529. The secondary component can assert wait request 529 to stall any transfers as needed. The interconnection module 503 captures read data 531 and provides a data valid signal 519 along with data 513 to the primary component 501.

According to various embodiments, a secondary component forces a primary component to wait an arbitrary number of clock cycles before a single data sequence can be returned. The wait is inefficient and prevents the primary component from doing any other processing until the wait request signal 517 and 529 is released. In other embodiments, a secondary component 505 may infrequently assert a wait request 529 to allow a number of read requests to accumulate.

Figure 6:
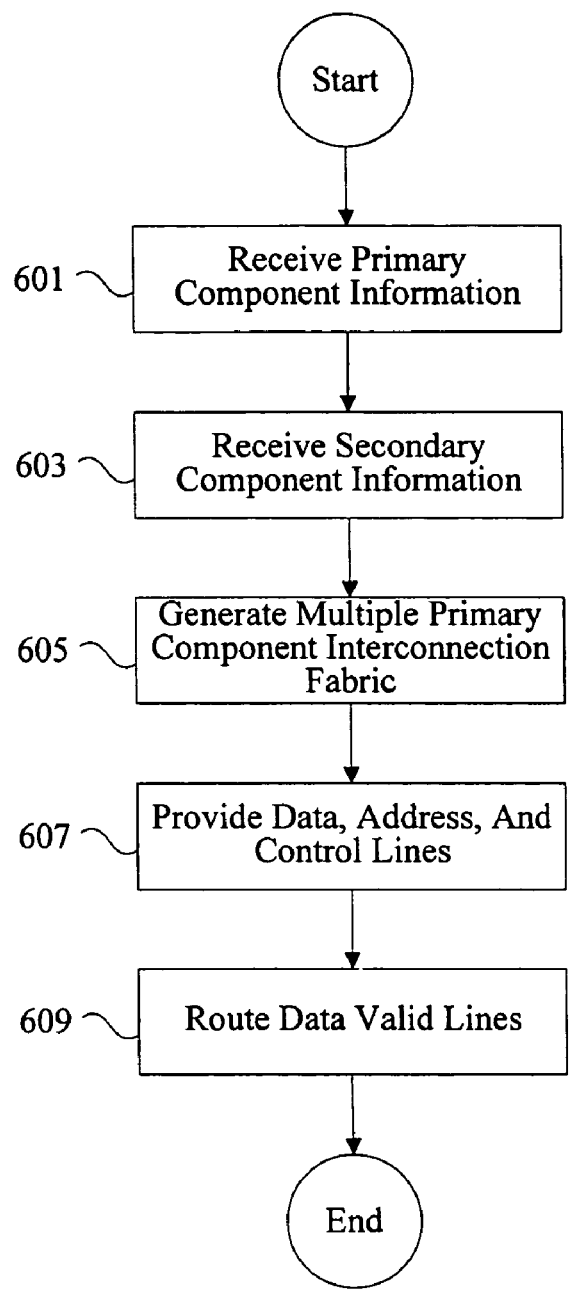
FIG. 6 is a flow process diagram showing a technique for configuring variable latency support.

FIG. 6 is a flow process diagrams showing one example of a technique for configuring support for variable latency using a programmable chip tool. At 601, primary components such as processor cores, Ethernet components, DMA controllers, etc., are identified for implementation on the programmable device. At 603, secondary components including peripherals such as memory components are identified. At 605, an interconnection component is generated. In one example, a bus fabric along with bus arbitration logic is generated. In another example, a simultaneous multiple primary component interconnection fabric is generated. At 607, data, address, and control lines are arranged to connect the primary and secondary components through the interconnection module. In one example, address, data, control, wait request, clock, and chip select lines are generated to allow communication between primary and secondary components. At 609, data valid lines are also provided. In some instances, data valid lines are referred to as included in the set of control lines. A data valid line allows a secondary component to indicate to a primary component that data is available.

In some embodiments, a primary component posts a read to the secondary component, and if a wait request is not signaled, the primary component is free to access other secondary components while waiting for the data valid signal. Furthermore, the primary component can re-access the same secondary component before any previous requests are satisfied. The wait signal remains functional in the case that the secondary components buffer becomes filled with read requests. Data, in general, can be returned at a higher overall rate using variable latency.

According to various embodiments, data, control, and address lines including a data valid line supporting variable latency are automatically generated using a tool or generator program operable to configure a programmable chip. In some instances, a user can select, parameterize, and connect components automatically using the programmable chip tool. A user can select whether components should support fixed or variable latency and appropriate control lines are generated to support the desired configuration.

Figure 7:
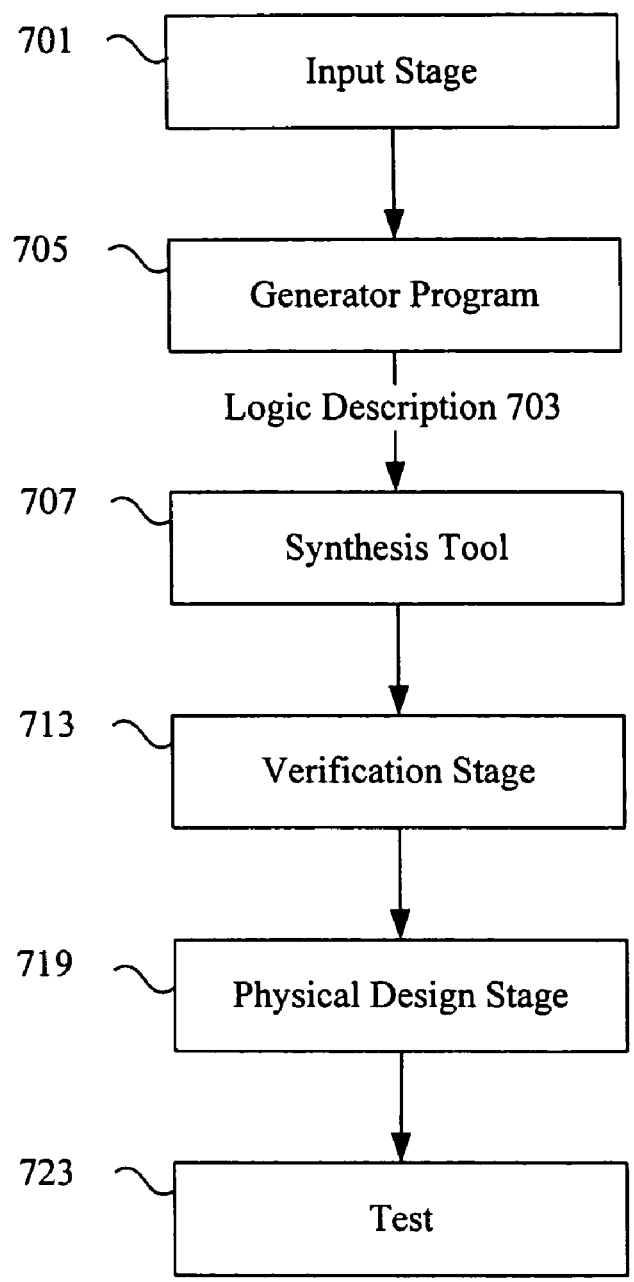
FIG. 7 is a diagrammatic representation showing implementation of a programmable chip.

FIG. 7 is a diagrammatic representation showing implementation of an electronic device using a programmable chip tool. An input stage 701 receives selection information typically from a user for logic such as a processor core as well as other components such as a streaming output device to be implemented on an electronic device. A generator program 705 creates a logic description and provides the logic description along with other customized logic to any of a variety of synthesis tools, place and route programs, and logic configuration tools to allow a logic description to be implemented on an electronic device.

In one example, an input stage 701 often allows selection and parameterization of components to be used on an electronic device. The input stage 701 also allows configuration of variable or fixed latency support. In some examples, components provided to an input stage include intellectual property functions, megafunctions, and intellectual property cores. The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various modules selected.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. According to various embodiments, the generator program 705 also provides information to a synthesis tool 707 to allow HDL files to be automatically synthesized. In some examples, a logic description is provided directly by a designer. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 709.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description. Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
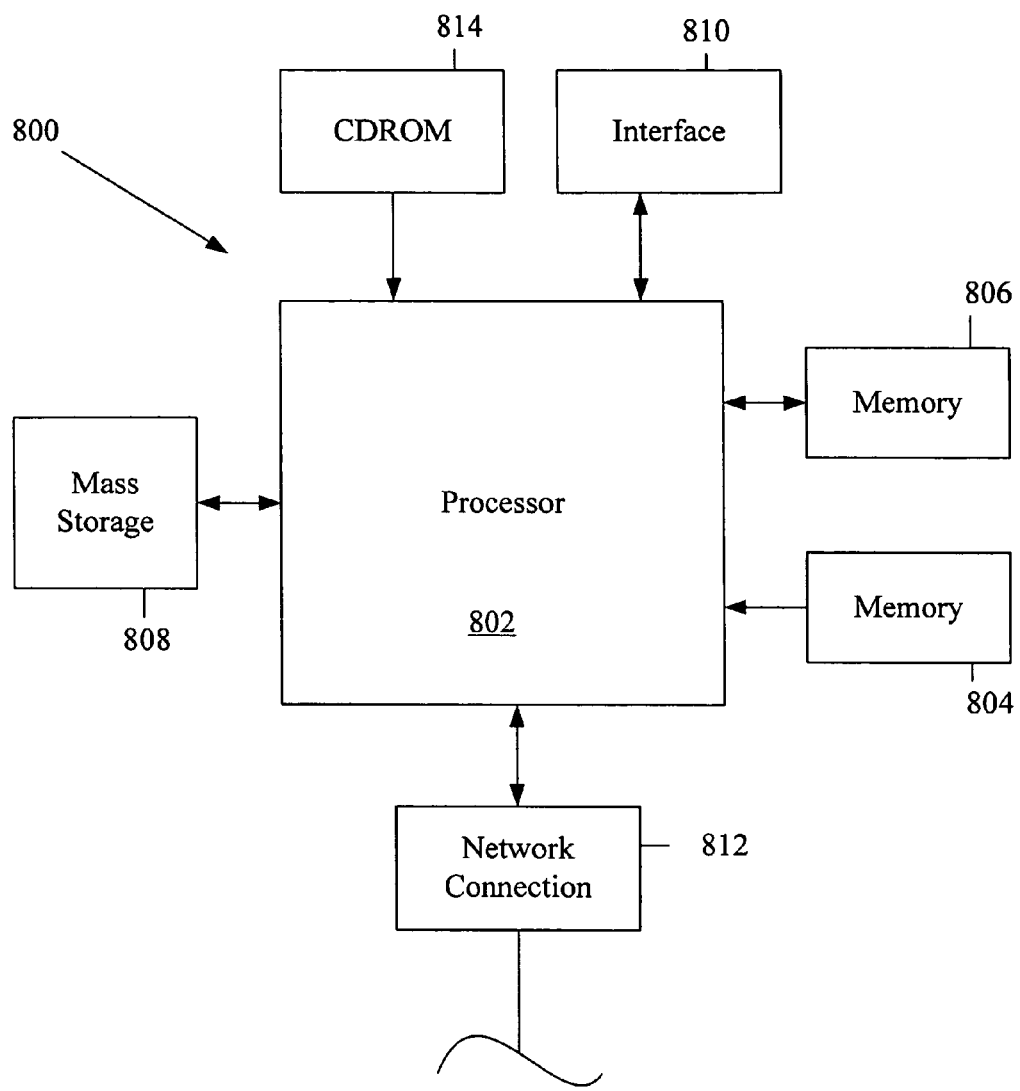
FIG. 8 is a diagrammatic representation of a system that can be used to implement the programmable chip.

FIG. 8 illustrates a typical computer system that can be used to implement a programmable chip having shared I/O lines. The computer system 800 includes any number of processors 802 (also referred to as central processing units, or CPUs) that are coupled to devices including memory 806 (typically a random access memory, or "RAM"), memory 804 (typically a read only memory, or "ROM"). The processors 802 can be configured to generate a test sequences for any designated processor. As is well known in the art, memory 804 acts to transfer data and instructions unidirectionally to the CPU and memory 806 is used typically to transfer data and instructions in a bidirectional manner.

Both of these memory devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than memory. The mass storage device 808 can be used to hold a library or database of prepackaged logic or intellectual property functions, as well as information on generating particular configurations. It will be appreciated that the information retained within the mass storage device 808, may, in appropriate cases, be incorporated in standard fashion as part of memory 806 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. It should be noted that the system 800 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 808 or 814 and executed on CPU 808 in conjunction with primary memory 806.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. Although shared I/O lines have been described in the context of a memory controller and a simultaneous multiple primary component switch fabric, shared I/O lines can be used in a system without a memory controller and/or without a simultaneous multiple primary component switch fabric. It is therefore intended that the invention be interpreted to include all variations and equivalents that fall within the true spirit and scope of the present invention.

What is claimed is:

1. A method for configuring on a programmable chip, the method comprising:
   receiving information associated with a primary component, the primary component having either fixed latency or variable latency characteristics;
   receiving information associated with a secondary component, the secondary component configurable as either a fixed latency or a variable latency component, wherein the secondary component is operable to respond to requests from the primary component;
   providing a selection mechanism to a user to have the primary component access the secondary component using fixed latency or variable latency;
   receiving a selection from the user to have the primary component issue a plurality of reads to the secondary component using variable latency; and
   generating an interconnection module coupling the primary component to the secondary component, the interconnection module including data, address, and control lines, wherein the interconnection module supports a system having both fixed latency and variable latency components.

2. The method of claim 1, wherein data, address, and control lines include a data valid line indicating that data is available for transfer from the secondary component.

3. The method of claim 1, wherein the secondary component is operable to receive multiple requests from the primary component before responding.

4. The method of claim 3, wherein the secondary component asserts a wait request line if the secondary component can no longer receive any additional requests.

5. The method of claim 1, wherein the data valid line allows a secondary component read transfer with variable latency.

6. The method of claim 1, wherein a user configures variable latency while selecting the primary and secondary components.

7. The method of claim 1, wherein interconnection circuitry comprises a simultaneous multiple primary component fabric.

8. The method of claim 7, wherein the secondary component is associated with a buffer for holding data available for transfer from the secondary component.

9. The method of claim 8, wherein the primary component is a generic processor module from a component library.

10. The method of claim 9, wherein the secondary component is a generic memory module from a component library.

11. A system for configuring a programmable chip, the system comprising:
    an input interface configured to receive information associated with a primary component and information associated with a secondary component, the secondary component configurable as either a fixed latency or a variable latency component, wherein the secondary component is operable to respond to requests from the primary component;
    an output interface configured to provide a selection mechanism to a user to have the primary component access the secondary component using fixed latency or variable latency, wherein the input interface receives a selection from the user to have the primary component issue a plurality of reads to the secondary component using variable latency in response to providing the selection mechanism; and
    a processor configured to generate interconnection circuitry coupling the primary component to the secondary component, the interconnection module including data, address, and control lines for the programmable chip, wherein the interconnection module supports a system having both fixed and variable latency components.

12. The system of claim 11, wherein data, address, and control lines include a data valid line indicating that data is available for transfer from the secondary component.

13. The system of claim 11, wherein the secondary component is operable to receive multiple requests from the primary component before responding.

14. The system of claim 13, wherein the secondary component asserts a wait request line if the secondary component can no longer receive any additional requests.

15. The system of claim 11, wherein the data valid line allows a secondary component read transfer with variable latency.

16. The system of claim 11, wherein a user configures variable latency while selecting the primary and secondary components.

17. The system of claim 11, wherein interconnection circuitry comprises a simultaneous multiple primary component fabric.

18. The system of claim 17, wherein the secondary component is associated with a buffer for holding data available for transfer from the secondary component.

19. The system of claim 18, wherein the primary component is a generic processor module from a component library.

20. The system of claim 19, wherein the secondary component is a generic memory module from a component library.

21. A computer readable medium comprising computer code for configuring a programmable chip, the computer readable medium comprising:
 computer code for receiving information associated with a primary component, the primary component configurable as either a fixed latency or a variable latency component;
 computer code for receiving information associated with a secondary component, the secondary component configurable as either a fixed latency or a variable latency component, wherein the secondary component is operable to respond to requests from the primary component;
 computer code for providing a selection mechanism to a user to have the primary component access the secondary component using fixed latency or variable latency;
 computer code for receiving a selection from the user to have the primary component issue a plurality of reads to the secondary component using variable latency, and
 computer code for generating interconnection circuitry coupling the primary component to the secondary component, the interconnection module including data, address, and control lines, wherein the interconnection module support a system having both fixed and variable latency components.

22. The computer readable medium of claim 21, wherein data, address, and control lines include a data valid line indicating that data is available for transfer from the secondary component.

23. The computer readable medium of claim 21, wherein the secondary component is operable to receive multiple requests from the primary component before responding.

24. The system of claim 23, wherein the secondary component asserts a wait request line if the secondary component can no longer receive any additional requests.

25. The computer readable medium of claim 21, wherein the data valid line allows a secondary component read transfer with variable latency.

26. The computer readable medium of claim 21, wherein a user configures variable latency while selecting the primary and secondary components.

27. The computer readable medium of claim 21, wherein interconnection circuitry comprises a simultaneous multiple primary component fabric.

* * * * *